United States Patent
Furui

(10) Patent No.: US 7,498,237 B2
(45) Date of Patent: Mar. 3, 2009

(54) METHOD OF MANUFACTURING DEVICES, POSITIONING METHOD, DICING METHOD AND DICING APPARATUS

(75) Inventor: Toshikazu Furui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 130 days.

(21) Appl. No.: 11/584,630

(22) Filed: Oct. 23, 2006

(65) Prior Publication Data

US 2007/0281443 A1 Dec. 6, 2007

(30) Foreign Application Priority Data

Jun. 6, 2006 (JP) ............................... 2006-156980

(51) Int. Cl.
H01L 21/46 (2006.01)
H01L 21/78 (2006.01)
H01L 21/301 (2006.01)

(52) U.S. Cl. ...................... 438/462; 438/113; 438/460; 257/E21.499; 257/E21.596; 257/E21.517

(58) Field of Classification Search ................. 438/113, 438/458, 460, 462, 463
See application file for complete search history.

(56) References Cited

U.S. PATENT DOCUMENTS 3,483,068 A * 12/1969 Brill et al. .................... 428/328
5,983,483 A * 11/1999 Tarumizu ...................... 29/559
6,120,967 A * 9/2000 Hopper et al. .......... 430/137.14
6,890,242 B2 * 5/2005 Tsuihiji et al. ................. 451/28
2006/0157540 A1 * 7/2006 Sumita et al. ........... 228/180.22

FOREIGN PATENT DOCUMENTS

JP 6-331813 12/1994
JP 7-29859 1/1995

OTHER PUBLICATIONS

Office Action of German Patent Office dated Feb. 4, 2008.

* cited by examiner

Primary Examiner—David Nhu
(74) Attorney, Agent, or Firm—Kratz, Quintos, Hanson, LLP.

(57) ABSTRACT

In a dicing method, a dicing is performed in such a way that in such a way that a device substrate, on which two or more devices and alignment marks for positioning are formed, is positioned in accordance with the alignment mark. The dicing method comprises: a substrate fixing step of fixing the device substrate on a fixed stand in a state that the device substrate is covered with coagulant and the coagulant is coagulated; a positioning step of performing a positioning based on the alignment mark in such a manner that a partial area, in which the alignment mark on the device substrate fixed on the fixed stand is formed, is locally heated to melt the coagulant at the partial area, so that the alignment mark is observed through the melted coagulant; and a dicing step of dicing the device substrate and separating the device substrate into the individual device elements.

5 Claims, 8 Drawing Sheets

METHOD OF MANUFACTURING DEVICES, POSITIONING METHOD, DICING METHOD AND DICING APPARATUS

BACKGROUND OF THE INVENTION

1. Field of the Invention

The present invention relates to a method of manufacturing a device for performing a dicing in such a way that a substrate, on which two or more devices and alignment marks for positioning are formed, is positioned in accordance with the alignment mark, a positioning method, and dicing method and dicing apparatus in which the substrate is separated through the dicing to individual device elements equipped with individual devices.

2. Description of the Related Art

Hitherto, to perform a dicing for a device substrate in which two or more devices, such as semiconductor wafers, are made, generally, there is adopted such a process that the device substrate is fixed on a dicing table through putting the device substrate on an adhesive dicing tape, the device substrate is subjected to the dicing processing so as to be segmented into device elements referred to as a chip, and the device elements are picked up one by one from the dicing tape.

However, a state-of-the-art device including MEMS (Micro Electro Mechanical Systems) device, on which the research is advanced, has an extremely minute structure. Thus, when the device elements are picked up from the adhesive tape, the structure is damaged. This involves a problem that the yield is extremely low.

In order to improve this problem, there is proposed a method in which a device substrate is wrapped with the coagulant, without the use of the adhesive tape, and the coagulant is coagulated, so that the device substrate is fixed (cf. Japanese Patent Publication TokuKai. Hei. 10-230429, and Japanese Patent Publication TokuKai. Hei. 11-309639).

However, fixing of the device substrate by the coagulation of the coagulant involves a problem of a difficulty of positioning of the device substrate. For the dicing for the device substrate, there is a need that the device substrate is exactly positioned relatively to a dicing blade. To perform the positioning, when devices are made on the device substrate, an alignment mark is formed at a position determined exactly as to the devices, and the alignment mark is photographed by a camera, so that the positioning is carried out based on the alignment mark on the image. However, when the coagulant is coagulated, the coagulation brings about a state that the coagulant is opaque or light scattering. Thus, it is difficult for a camera to recognize the alignment mark. Before the coagulation of the coagulant, it is easy for the camera to recognize the alignment mark. However, the position may be shifted in the process in which the coagulant is coagulated, and thus the recognition of the alignment mark before the coagulation would not be useful for positioning.

It is considered that the device substrate is fixed with a material liquid with viscous high in place of the coagulant. In this case, it is possible to recognize the alignment mark. However, as compared with a case where a position is fixed by coagulation of the coagulant, the position of the device substrate changes easily. And, the dicing for the device substrate is carried out while the coolant such as the pure water is sprayed for cooling and the removal of the cutting powder. However, even if the device substrate is covered with a liquid material of high viscosity, the device substrate is pressured by spraying of the coolant, and as a result, the device will be damaged. This involves a problem that the yield is not sufficiently improved.

Japanese Patent Publication TokuKai. Hei. 6-331813 discloses a technology in which the substrate that forms the diffraction grating is put in the water tank that fills the pure water, and the pure water is frozen to fix the substrate and then subjected to cutting. This also easily brings about opaque or light scattering state at the time of freezing. Thus, according to the technology disclosed in Japanese Patent Publication TokuKai. Hei. 6-331813 too, it is difficult to perform a positioning base on the alignment mark.

Further, according to the second type of extended library apparatus show in FIG. 21, there are provided the same number of moving mechanisms as the number of coupled library apparatuses. Thus, as compared with the first type of extended library apparatus show in FIG. 19, which is capable of coping with coupling of a plurality of library apparatuses with one moving mechanism, it involves problems of high cost and increment of dissipation power.

SUMMARY OF THE INVENTION

In view of the foregoing, it is an object of the present invention to provide a method of manufacturing a device capable of surely fixing the device substrate without the use of the adhesive tape, and permitting the positioning based on the alignment mark and further capable of improving the yield, and dicing method and dicing apparatus in which the substrate is separated through the dicing to individual device elements equipped with individual devices.

To achieve the above-mentioned object, the present invention provides a method of manufacturing devices comprising:

a step of putting on a fixed stand a substrate on which two or more devices and alignment marks are formed;

a step of covering the substrate with coagulant;

a step of coagulating the coagulant;

a step of heating a partial area on the substrate to melt the coagulant on the partial area so that the alignment mark is exposed;

a step of positioning the substrate in accordance with the exposed alignment mark; and a step of dicing the positioned substrate.

In the method of manufacturing devices according to the present invention as mentioned above, it is preferable that melting of the coagulant is carried out by irradiation of beam of light of infrared wavelength onto the partial area.

To achieve the above-mentioned object, the present invention provides a positioning method of positioning a positioning object with which an alignment mark is formed by using the mark, the positioning method comprising:

a step of melting a part of coagulant that covers the positioning object to expose the alignment mark; and a step of positioning the positioning object referring to the exposed alignment mark.

To achieve the above-mentioned object, the present invention provides a dicing method in which a dicing is performed in such a way that a device substrate, on which two or more devices and alignment marks for positioning are formed, is positioned relatively to a dicing blade for dicing the device substrate in accordance with the alignment mark, and the device substrate is subjected to the dicing by the dicing blade, and is separated to individual device elements equipped with individual devices, the dicing method comprising:

a substrate fixing step of fixing the device substrate on a fixed stand in a state that the device substrate is covered with coagulant and the coagulant is coagulated;

a positioning step of performing a positioning based on the alignment mark in such a manner that a partial area, in which the alignment mark on the device substrate fixed on the fixed stand is formed, is locally heated to melt the coagulant at the partial area, so that the alignment mark is observed through the melted coagulant; and a dicing step of dicing the device substrate and separating the device substrate into the individual device elements.

According to the method of manufacturing devices and the dicing method of the present invention, the device substrate is covered with the coagulant to be coagulated. This feature makes it possible to surely fix the device substrate. Further, according to the method of manufacturing devices and the dicing method of the present invention, an approximate position where the alignment mark exists can be grasped. Thus, locally melting only the coagulant of the partial area where the alignment mark exists makes it possible to recognize the alignment mark through the melted coagulant, while the device substrate is surely fixed.

Further, in the dicing, the device substrate is covered with the coagulated coagulant. This feature makes it possible to prevent damages of the device by spraying of coolant, and thereby improving the yield.

In dicing method according to the present invention as mentioned above, it is preferable that the positioning step heats locally the partial area by irradiating laser beam onto the partial area.

The irradiation of the laser beam makes it possible to locally heat only the intended area readily.

To achieve the above-mentioned object, the present invention provides a dicing apparatus in which a dicing is performed in such a way that a device substrate, on which two or more devices and alignment marks for positioning are formed, is positioned in accordance with the alignment mark, and the device substrate is subjected to the dicing, and is separated to individual device elements, the dicing apparatus comprising:

a fixed stand on which the device substrate is fixed;

a dicing blade dicing the device substrate fixed on the fixed stand;

a heating means that locally heats a partial area of the alignment mark on the device substrate covered by a coagulant on the fixed stand;

a camera imaging a position wherein the coagulant is melted by heating by the heating means; and a positioning means positioning the device substrate relatively to the dicing blade in accordance with the alignment mark on an image obtained by the camera.

In the dicing apparatus according to the present invention as mentioned above, it is preferable that the heating means is a laser for projecting laser beams to the partial area to heat the partial area.

To achieve the above-mentioned object, the present invention provides a dicing apparatus in which a dicing is performed in such a way that a device substrate, on which two or more devices and alignment marks for positioning are formed, is positioned in accordance with the alignment mark, and the device substrate is subjected to the dicing, and is separated to individual device elements, the dicing apparatus comprising:

a fixed stand on which the device substrate is fixed;

a dicing blade dicing the device substrate fixed on the fixed stand;

a light source that generates beams of light to be projected onto a partial area of the alignment mark on the device substrate covered by a coagulant on the fixed stand;

a camera imaging a position wherein the coagulant is melted by irradiation of the beam of light from the light source;

a detection section that detects the alignment mark from an image obtained by the camera; and a positioning means positioning the device substrate relatively to the dicing blade in accordance with the alignment mark detected by the detection section.

DETAILED DESCRIPTION OF PREFERRED EMBODIMENTS

Embodiments of the present invention will be described with reference to the accompanying drawings.

Figure 1:
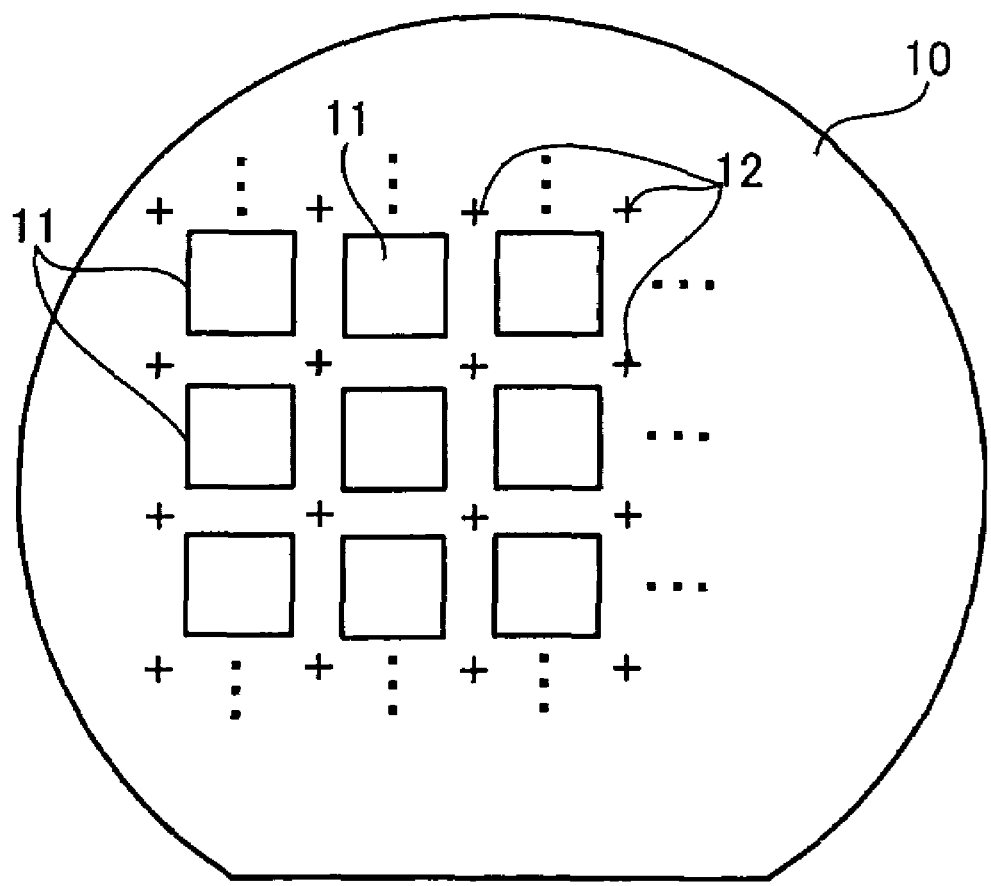
FIG. 1 is a typical illustration of devices and alignment marks which are formed on a device substrate.

FIG. 1 is a typical illustration of devices and alignment marks which are formed on a device substrate.

As seen from FIG. 1, it is formed two or more devices 11 lined up on a device substrate 10, and alignment marks 12 are formed among the associated devices 11. For dicing, the device substrate 10 is cut to cross the alignment marks 12, so that the device substrate 10 is segmented into device elements each equipped with a device.

In FIG. 1, the purpose of this is to be comprehensible only though the devices 11 are drawn in an extremely big size compared with the size of the device substrate 10.

The present embodiment is not interested in functions of the devices 11, and FIG. 1 simply shows an arrangement of the devices 11.

Further, in FIG. 1, the alignment marks 12 are regularly arranged corresponding to each device 11. However, it is acceptable that the alignment marks 12 are formed only at positions necessary for the positioning. The size of the alignment mark 12 is usually tens of u meter level.

Figure 2:
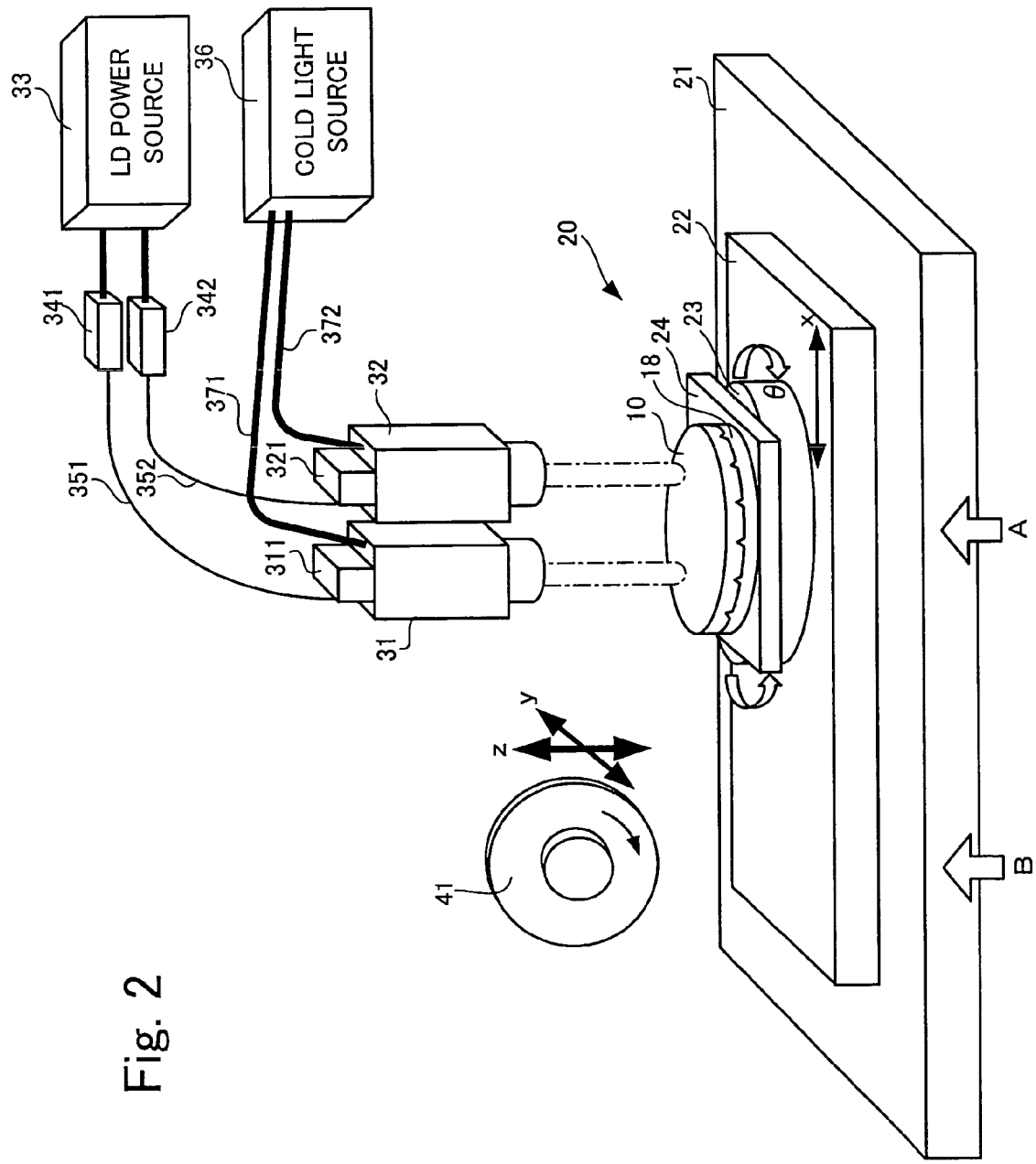
FIG. 2 is a schematic diagram of a dicing apparatus.

FIG. 2 is a schematic diagram of a dicing apparatus.

A dicing table 20, on which the device substrate 10 is put, comprises: a base 21; an x-stage 22 that moves on the base 21 in directions of an arrow x indicated in FIG. 2; a θ-stage 23 that rotates in a direction of an arrow θ, the θ-stage 23 being disposed on the x-stage 22; and a tabular chuck 24 put on the θ-stage 23. The device substrate 10 is fixed via a dummy substrate 18 on the tabular chuck 24 in a manner as will be described later.

The device substrate 10, which is fixed on the tabular chuck 24, is subjected to a positioning through recognition of the alignment mark on the device substrate 10 at a substrate alignment position A, and thereafter the x-stage 22 moves, so that the device substrate 10 moves to a dicing position B.

Thus, the dicing for the device substrate 10 is carried out by a dicing blade 41 that is disposed upper the dicing position B.

Above the substrate alignment position A, there are provided two optical modules 31 and 32 having CCD cameras 311 and 321, respectively. Connected to the optical modules 31 and 32 are optical fibers 351 and 352, respectively, which introduce infrared laser beams emitted from LD modules 341 and 342 that are driven by an LD power source 33, respectively. A cold light source 36 emits cold light in which infrared rays light is omitted. Light introducing tubes 371 and 372, which introduce the cold light, are connected to the optical modules 31 and 32, respectively.

Two optical modules 31 and 32 project infrared laser beams introduced through the optical fibers 351 and 352 to partial areas on the device substrate 10, in which one alignment mark 12 (cf. FIG. 1) is formed for each laser beam, so that coagulant (it will be described later) of the partial areas is melted, and then project cold lights to the partial areas so that the CCD cameras 311 and 321 take in images of the partial areas, respectively. According to the present embodiment, a position operating unit (not illustrated) is used to perform the positioning in accordance with the alignment mark on the image.

The positioning is performed in such a way that as to the rotating direction, the θ-stage 23 rotates, as to the x-direction, the x-stage 22 moves, and as to the y-direction, the dicing blade 41 moves. The dicing blade 41 also moves in the height direction (z-direction) to perform the positioning also regarding the height direction (z-direction).

Figure 3:
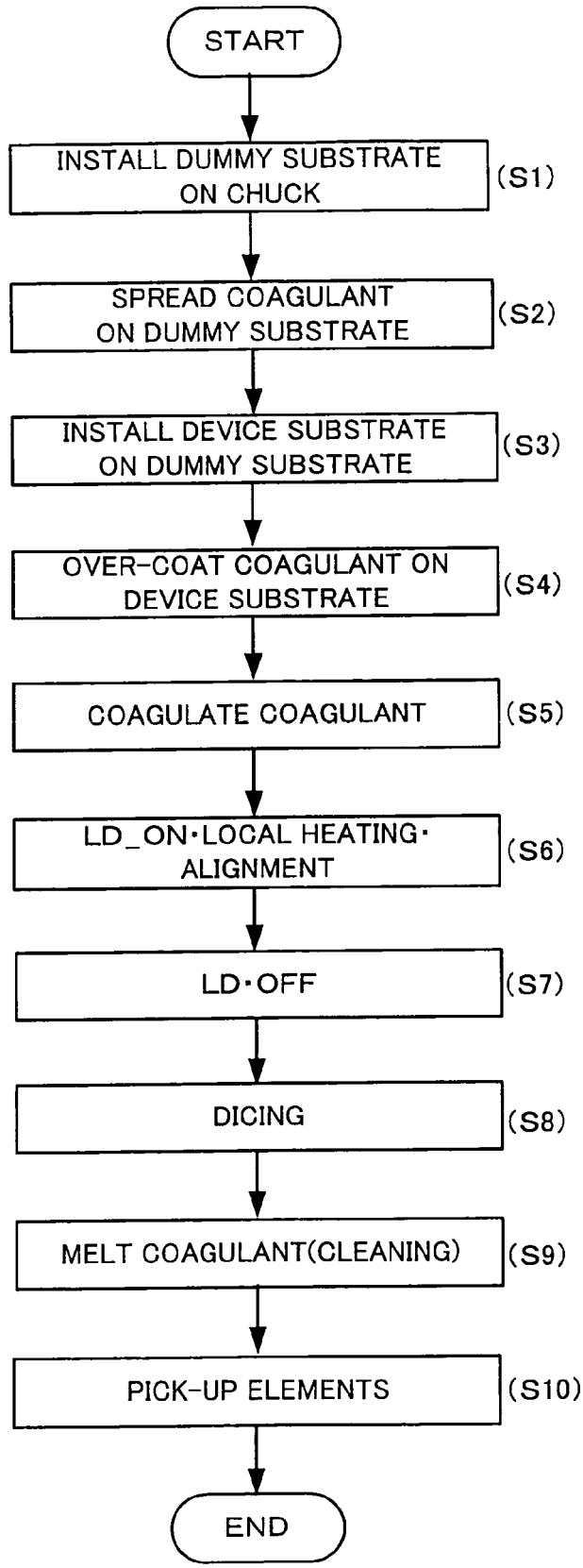
FIG. 3 is a flowchart useful for understanding a dicing method using the dicing apparatus shown in FIG. 2.
Figure 4:
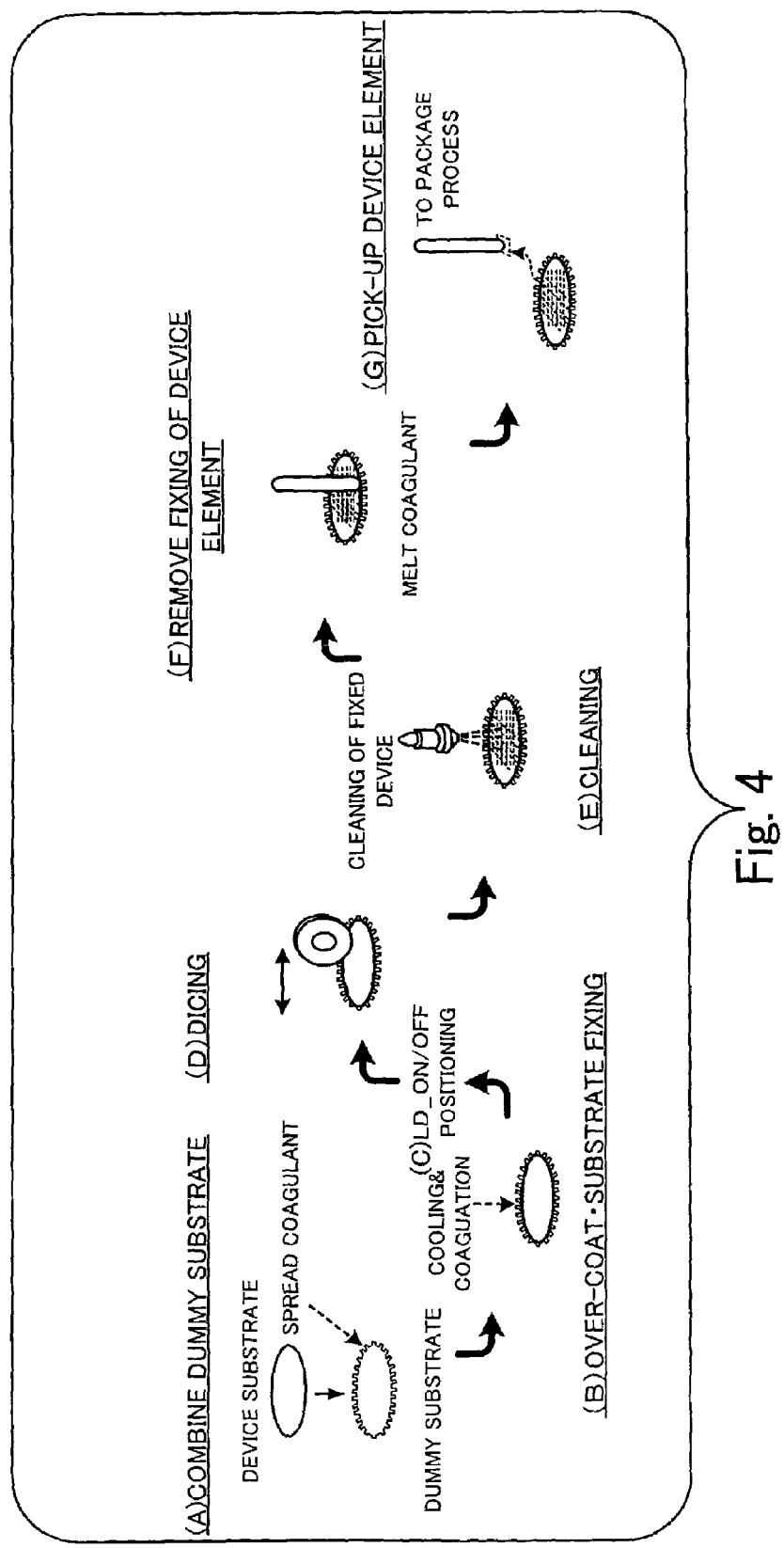
FIG. 4 is a typical illustration useful for understanding a dicing method using the dicing apparatus shown in FIG. 2.

FIG. 3 is a flowchart useful for understanding a dicing method using the dicing apparatus shown in FIG. 2. FIG. 4 is a typical illustration useful for understanding a dicing method using the dicing apparatus shown in FIG. 2.

First, as shown in FIG. 2, the dummy substrate 18 is installed on the chuck 24 of the dicing table 20 (step S1), and the coagulant is spread on the dummy substrate 18 (step S2). Next, the device substrate 10 is installed on the dummy substrate 18 (step S3), and the coagulant is over-coated on the device substrate 10 (step S4). When the device substrate 10 cools, the coated coagulant is coagulated (step S5). The coagulant used is optical penetration to extent in which the device substrate under that is seen while having at least melted. The coagulant used has such a character that it is kept in the state that coagulates by cooling at the normal temperature, and it melts by heating. As the coagulant, it is possible to use, for example, octamethylcyclotetrasiloxane and the like.

Next, the device substrate 10 is positioned based on the alignment marks 12 in such a manner that the LD power source 33 shown in FIG. 2 is turned on to turn on laser diodes (LD), which are incorporated into the LD modules 341 and 342, so that portions of the alignment marks 12, of the coagulant which covers the device substrate 10, are heated, and areas melted by heating are observed by the CCD cameras 311 and 321 (step S6). The laser diodes (LD) are turned off after the completion of positioning of the device substrate 10. When the laser diodes (LD) are turned off (step S7), portions where the coagulant melted return at the normal temperature, too and the portions coagulate again.

Next, the x-stage 22 moves to carry the device substrate 10 to the dicing position B, so that the device substrate 10 is subjected to the dicing by the dicing blade 41 (step S8).

After the termination of the dicing too, the fixing of the device substrate 10 is maintained, the surface of the device substrate 10 is cleaned, and the coagulant is melted (step S9). And thereafter, the device elements separated by the dicing are picked up one by one and are carried to the subsequent package process (step S10).

In the event that the coagulant is melted (step S9), and the device elements are picked up (step S10), it is preferable that the coagulant is melted for each device element to be picked up, immediately before the pick up, but not being simultaneously melted throughout the device substrate 10. This feature makes it possible to suppress misregistration of the device element to the minimum.

Hereinafter, there will be explained aspects of the present embodiment as mentioned above including modified embodiments.

Figure 5:
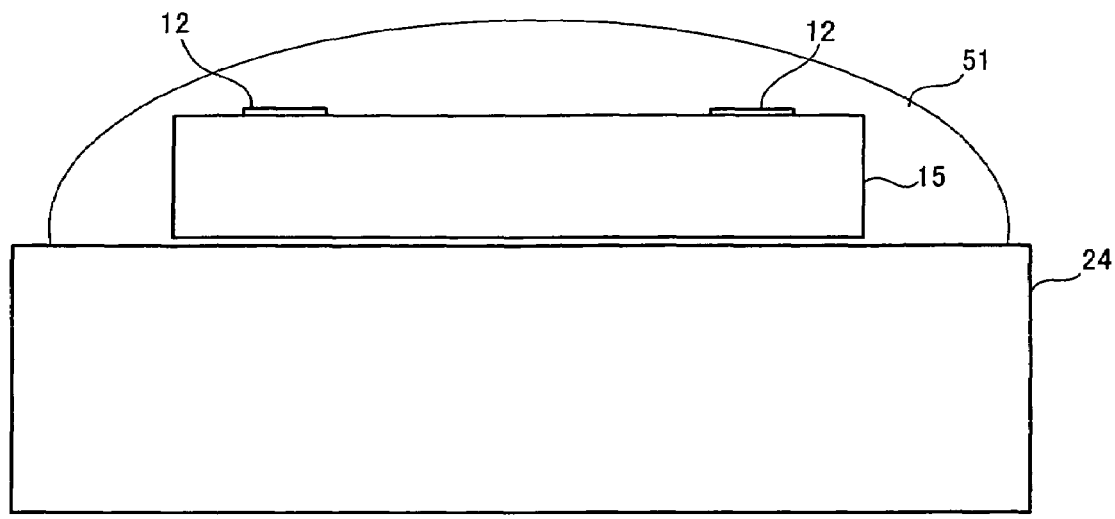
FIG. 5 is a typical illustration showing a state that the substrate is fixed on a chuck.

FIG. 5 is a typical illustration showing a state that the substrate is fixed on a chuck. In FIG. 5, a combination of the device substrate and the dummy substrate is referred to as a substrate 15.

The substrate 15, which comprises the device substrate 10 and the dummy substrate 18, is put on the chuck 24, and is covered by coagulant 51 in a state of coagulation. The alignment marks 12 are formed on the substrate 15. The chuck 24 has a function of cooling for the substrate 15 which is put on the chuck 24. Thus, it is possible to effectively perform cooling and coagulation for the coagulant.

Figure 6:
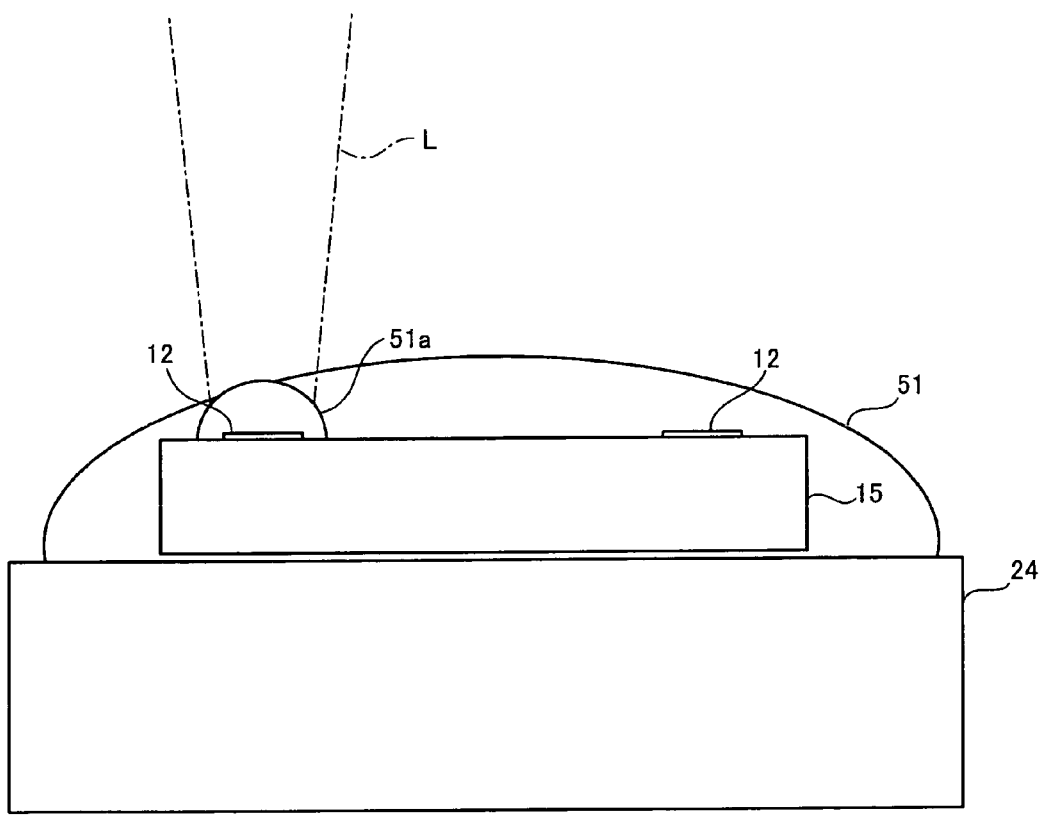
FIG. 6 is an explanatory view useful for understanding a state that the laser beam is irradiated on the substrate shown in FIG. 5.

FIG. 6 is an explanatory view useful for understanding a state that the laser beam is irradiated on the substrate shown in FIG. 5.

A laser beam L is irradiated on one of the alignment marks 12 formed on the substrate 15. Heating by the laser beam L causes a coagulant 51a on an area near the associated alignment mark 12, of the coagulant 51 to melt. This feature makes it possible to observe the alignment marks by the CCD cameras.

For the purpose of the better understanding, the size of the alignment marks 12 is emphasized. Actually, the size of the alignment marks 12 is tens of micrometer level. On the other hand, the spot diameter of the laser beam L is about a several millimeters. This size of the laser beam L greatly permits first misregistration where the substrate 15 is fixed on the chuck 24.

Figure 7:
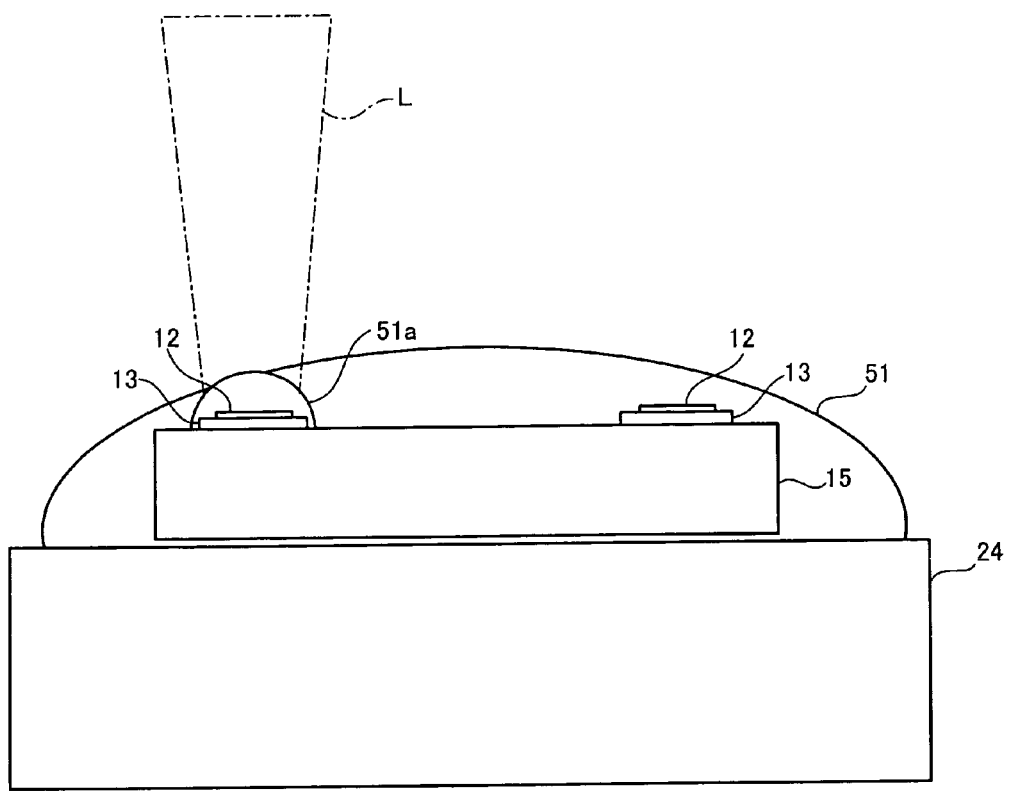
FIG. 7 is an explanatory view useful for understanding a first modification.

FIG. 7 is an explanatory view useful for understanding a first modification. There will be explained different points from FIG. 6.

In the event that the substrate 15 is formed with the material of the character to absorb infrared rays such as silicon and alumina easily, it is easy to melt the coagulant in the mode as shown in FIG. 6. However, in the event that the substrate is of material that penetrates infrared rays light/laser beam L like transparent glass substrate, quartz substrate or sapphire substrate, etc., because the irradiated part is not heated easily even if laser beam L is irradiated, the coagulant cannot be melted well as a result. Infrared rays absorption pad 13 is formed with the material that absorbs the infrared rays of the wavelength of laser beam L in the area including alignment mark 12 on the substrate 15 for such a condition. This feature makes it possible to melt coagulant in a partial area including alignment mark 12 through heating the coagulant in the area because the infrared rays absorption pad 13 absorbs laser beam L by doing so regardless of the material of substrate 15 and it overheats. For instance, the material that absorbs the infrared rays light can be formed by the method of spreading or the deposition, etc. to the alignment mark position.

Figure 8:
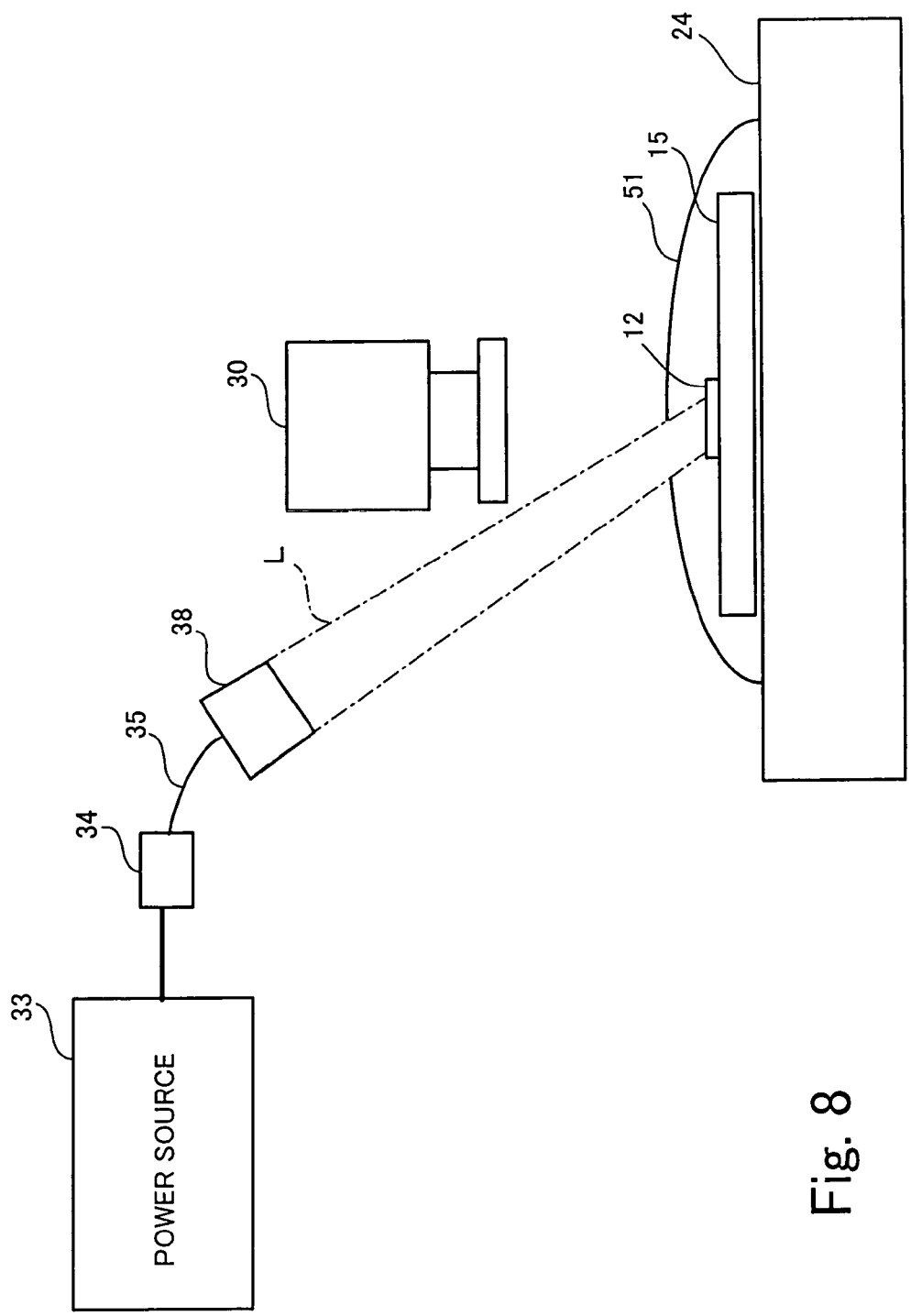
FIG. 8 is an explanatory view useful for understanding a second modification.

FIG. 8 is an explanatory view useful for understanding a second modification. There will be explained different points from FIG. 2.

The dicing apparatus shown in FIG. 8 comprises: a LD power source 33 for supplying an electric power to a laser diode (LD) to emit laser beams; a LD module 34 incorporating therein the laser diode (LD) which emits laser beams upon receipt of supply of electric power from the LD power source 33; an optical fiber 35 which introduces laser beams emitted from the LD module 34; a collimator lens 38 that receives the laser beam that has been led with the optical fiber 35 and irradiates laser beam L from the upper side aiming at the alignment mark 12 on the substrate 15. The CCD camera 30 is arranged on the alignment mark 12.

According to the embodiment shown in FIG. 2, the laser beams are also irradiated on device substrate 10 through the optical units 31 and 32. However, as shown in FIG. 8, it is acceptable to provide an arrangement that the beam irradiation system that irradiates laser beam L and the image taking system including CCD camera 30 are separated, and the laser beam L is irradiated from the upper side on the substrate 15.

While the present embodiment shows an example that the coagulant is melted by the laser beam L, it is acceptable to adopt other heating means as taking the place, for instance, a small type of heat generation material is brought close to the device substrate and a partial area of the coagulant melts, instead of laser beam L irradiation.

According to the embodiment shown in FIG. 2, the direction of θ and the direction of x are positioned by the dicing table 20 when the device substrate 10 is positioned, and the direction of y is positioned by the dicing blade 41. However, it is effective that the device substrate 10 is positioned to the dicing blade 41 relatively in such a manner that the x-y stage that moves to both the direction of x and the direction of y in place of the x stage 22 is adopted so that directions of θ, x, and y may be positioned with the dicing table 20.

As mentioned above, according to the present invention, it is possible to exactly recognize the alignment marks and improve the yield.

Although the present invention has been described with reference to the particular illustrative embodiments, it is not to be restricted by those embodiments but only by the appended claims. It is to be appreciated that those skilled in the art can change or modify the embodiments without departing from the scope and sprit of the present invention.

What is claimed is:

1. A method of manufacturing devices comprising the steps of:

putting on a fixed stand a substrate on which two or more devices and alignment marks are formed;

covering the substrate with coagulant;

coagulating the coagulant;

melting the coagulant on a partial area on the substrate by heating the partial area so that the alignment mark is exposed;

positioning the substrate in accordance with the exposed alignment mark; and dicing the positioned substrate.

2. A method of manufacturing devices according to claim 1, wherein melting of the coagulant is carried out by irradiation of beam of light of infrared wavelength onto the partial area.

3. A positioning method of positioning a positioning object with which an alignment mark is formed by using the alignment mark, the positioning method comprising the steps of:

melting a part of coagulant that covers the positioning object to expose the alignment mark; and positioning the positioning object referring to the exposed alignment mark.

4. A dicing method in which a dicing is performed in such a way that a device substrate, on which two or more devices and alignment marks for positioning are formed, is positioned relatively to a dicing blade for dicing the device substrate in accordance with the alignment mark, and the device substrate is subjected to the dicing by the dicing blade, and is separated to individual device elements equipped with individual devices, the dicing method comprising the steps of:

fixing the device substrate on a fixed stand in a state that the device substrate is covered with coagulant and the coagulant is coagulated;

performing a positioning based on the alignment mark in such a manner that a partial area, in which the alignment mark on the device substrate fixed on the fixed stand is formed, is locally heated to melt the coagulant at the partial area, so that the alignment mark is observed through the melted coagulant; and dicing the device substrate and separating the device substrate into the individual device elements.

5. A dicing method according to claim 4, wherein the positioning step heats locally the partial area by irradiating laser beam onto the partial area.

* * * * *